United States Patent
Si

(10) Patent No.: US 6,781,425 B2
(45) Date of Patent: Aug. 24, 2004

(54) CURRENT-STEERING CHARGE PUMP CIRCUIT AND METHOD OF SWITCHING

(75) Inventor: Weimin Si, San Jose, CA (US)

(73) Assignee: Atheros Communications, Inc., Sunnyvale, CA (US)

(*) Notice: Subject to any disclaimer, the term of this patent is extended or adjusted under 35 U.S.C. 154(b) by 0 days.

(21) Appl. No.: 10/233,862

(22) Filed: Sep. 3, 2002

(65) Prior Publication Data

US 2003/0042949 A1 Mar. 6, 2003

Related U.S. Application Data

(60) Provisional application No. 60/317,382, filed on Sep. 4, 2001.

(51) Int. Cl.[7] ............................................... H03L 7/06
(52) U.S. Cl. ..................................... 327/148; 327/157
(58) Field of Search ............................... 327/148, 156, 327/157; 375/374

(56) References Cited

U.S. PATENT DOCUMENTS

| | | | | |
|---|---|---|---|---|
| 5,945,855 A | * | 8/1999 | Momtaz | 327/157 |
| 6,147,561 A | | 11/2000 | Rhee et al. | 331/12 |
| 6,326,852 B1 | * | 12/2001 | Wakayama | 331/17 |
| 6,526,111 B1 | * | 2/2003 | Prasad | 375/376 |

OTHER PUBLICATIONS

Charge Pumps: An Overview; Louie Pylarinos, Edward S. Rogers Sr. Department of Electrical and Computer Engineering, University of Toronto.
A Novel CMOS Charge–Pump Circuit With Positive Feedback For PLL Applications; Esdras Juarez–Hernandez and Alejandro Diaz–Sanchez; Instituto Tecnologico de Chihuahua; Electro 2001; pp. 283–286.
Charge–Pump PLL Analysis; Jeffrey S. Pattavina, Aug. 6, 2001, pp. 1–12.

* cited by examiner

*Primary Examiner*—Linh M. Nguyen
(74) *Attorney, Agent, or Firm*—Reed Smith LLP

(57) ABSTRACT

A current-steering charge pump circuit and method for switch timing that reduces the amount of switching transients on an output current pulse produced by the charge pump. The current-steering type charge pump circuit includes four control signals, UP, UPB, DN and DNB. In order to produce an UP current pulse output signal, the UPB control signal is first asserted, followed by the UP control signal. After a period of time, which is proportional to the error signal that needs to be applied to a VCO, the UPB signal is first unasserted, followed by the UP signal. Similarly, to produce a DOWN current pulse output signal, a DN control is first asserted, followed by a DNB control signal. After a period of time, which is proportional to the error signal that needs to be applied to a VCO, the DN signal is first unasserted, followed by the DNB signal.

9 Claims, 6 Drawing Sheets

US 6,781,425 B2

CURRENT-STEERING CHARGE PUMP CIRCUIT AND METHOD OF SWITCHING

This application claims priority to U.S. Provisional Application Ser. No. 60/317,382, filed Sep. 4, 2001 entitled PHASE-LOCKED LOOP, the disclosure of which is herein incorporated by reference.

BACKGROUND OF THE INVENTION

1. Field of the Invention

The present invention relates generally to the field of phase-locked loop (PLL) electronic circuits, and more particularly to an improved switch timing of a charge pump for use in a phase-locked loop circuit.

2. Description of the Related Art

Fully integrated phase-locked loop (PLL) circuits have been widely used in areas such as communications, wireless systems, digital circuits, and disk drive electronics. The operation of conventional charge pump-based phase locked loop circuits are well known in the art. For example, U.S. Pat. No. 6,147,561 describes the operation of the basic block diagram shown in FIG. 1. As described therein, the phase locked loop circuit includes a phase/frequency detector (PFD) 14, a charge pump 18, a loop filter 20, a voltage-controlled oscillator (VCO) 22, a reference divider 12 and an M divider 24.

The basic PLL circuit of FIG. 1 receives an input reference clock signal 10, in form of square waves with reference frequency $f_{ref}$, from a reference frequency source, not shown, usually a crystal oscillator which generates a low jitter or low phase noise reference signal at a known frequency. The reference divider 12 divides the input signal 10 reference frequency $f_{ref}$ by an integer R, to allow use of a higher frequency reference source.

The phase/frequency detector 14 has two input terminals, the reference input and the feedback input. The output signal 13 of the reference divider 12 is provided as the reference input signal of the phase/frequency detector 14. The PLL circuit output signal 16 with frequency $f_{out}$, which is the output of the VCO 22, is divided by the M divider 24. The output signal 25 of the M divider 24 is provided as the feedback input signal into the phase/frequency detector 14.

The phase/frequency detector 14 outputs an UP signal 19 and a DOWN signal 15. When the phase of the reference input signal 13 leads the feedback input signal 25, the phase/frequency detector 14 outputs longer UP pulses and shorter DOWN pulses. When the phase of the feedback input signal 25 leads the reference input 13, the phase/frequency detector 14 outputs longer DOWN pulses and shorter UP pulses. The duration difference of UP and DOWN pulses equals the phase difference of the reference input signal and the feedback input signal.

The charge pump 18 is an analog circuit controlled by the phase/frequency detector outputs, that is, the UP signal 19 and DOWN signal 15, which acts in response to an indication of a phase difference between signals supplied by the reference frequency source and signals supplied by the voltage controlled oscillator 22. The charge pump 18 generates phase error correction current pulses supplied to the loop filter 20 based on the UP/DOWN pulses provided by the phase/frequency detector, in order to pull the input voltage of the voltage controlled oscillator 22 up or down to adjust the frequency of the VCO output signal 16. Conventional charge pump circuits typically contain a current source and a current sink to pull the charge pump 18 output voltage up or down, respectively, by providing appropriate current to a capacitive input of the loop filter 20.

The loop filter 20 smoothes the phase/frequency detector 14 output voltage and determines the loop performance, based upon selected loop filter 20 elements. The output of the loop filter 20 adjusts the input voltage of the voltage-controlled oscillator (VCO) 22 and determines the frequency $f_{out}$ of the output signal 16 of the VCO 22 and the PLL circuit. The output signal 16 of the VCO 22 is then fed back, divided by integer M in the M divider 24, and input into the feedback input of the phase/frequency detector 14.

The PLL circuit produces an output signal 16 whose frequency $f_{out}$ is equal to the value $[(f_{ref}/R)*M]$, and the phase of the VCO output signal 16 follows the phase of the input reference signal 10. Therefore, the feedback of the PLL provides a means for locking the phase and frequency $f_{out}$ of the output signal 16 in accordance with the phase and frequency of the input reference signal 10. If the input reference signal 10 has a highly stable reference frequency, the PLL circuit produces the output signal 16 with a highly stable frequency $f_{out}$.

Conventional charge pump circuits, however, produce switching transients in the output current pulse signal, which adversely affects the PLL circuit performance. It would be desirable to reduce these switching transients.

SUMMARY OF THE INVENTION

In general, the present invention is an improved switching procedure for the current steering type charge pump circuit. A current steering type charge pump circuit according to an embodiment of the present invention includes four control signals, UP, UPB, DN and DNB. In order to produce an UP current pulse output signal, the UPB control signal is first asserted (turned "on"), followed by the UP control signal. After a period of time, which is proportional to the error signal that needs to be applied to a VCO, the UPB signal is first unasserted (turned "off"), followed by the UP signal. This procedure isolates the output during the switching time, and thereby reduces the transients and ripples on the output current signal.

Similarly, to produce a DOWN current pulse output signal (i.e. a "sink" current pulse), a DN control is first asserted, followed by a DNB control signal. After a period of time, which is proportional to the error signal that needs to be applied to a VCO, the DN signal is first unasserted (turned "off"), followed by the DNB signal.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

Figure 1:
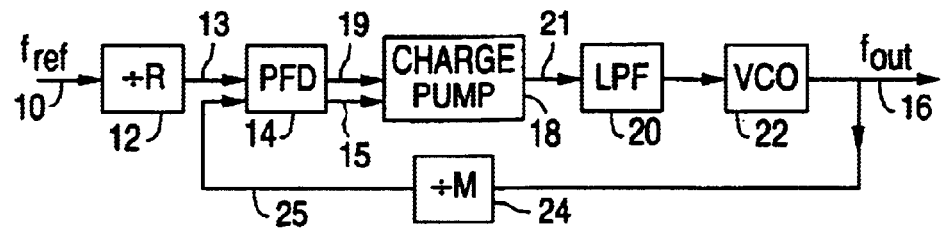
FIG. 1 is a block diagram of a conventional phase-locked loop circuit utilizing a charge pump circuit.
Figure 2:
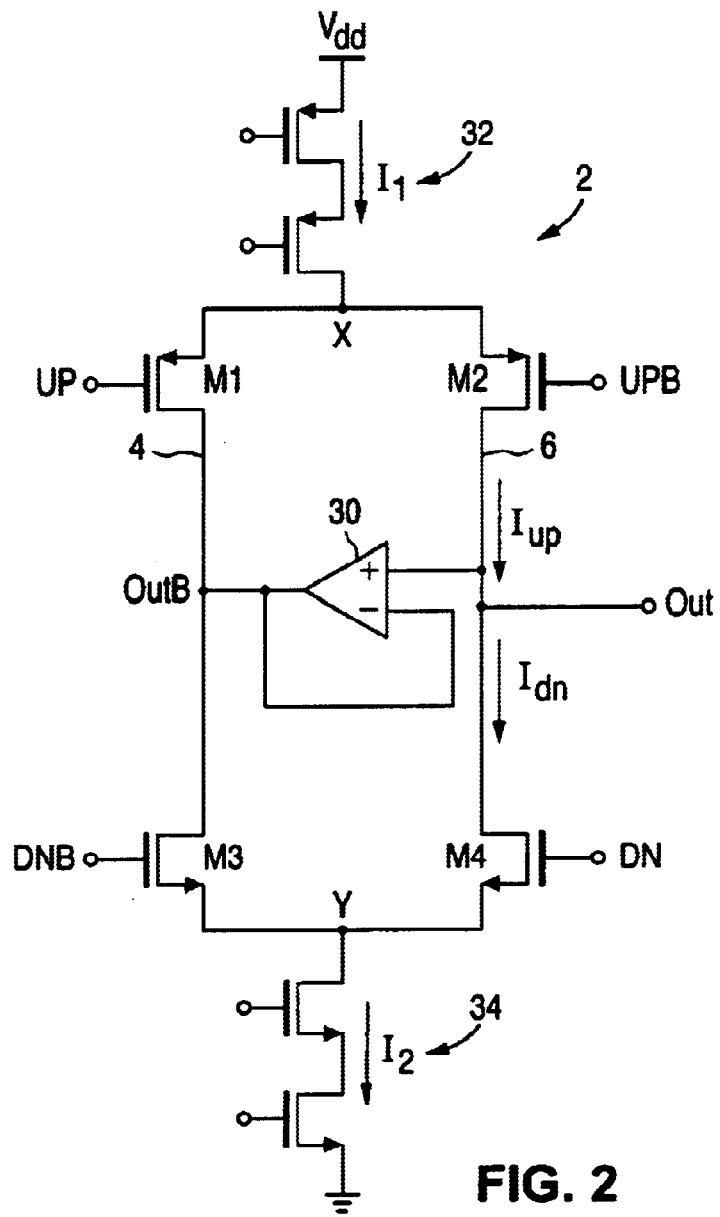
FIG. 2 is a schematic diagram of a current steering type charge pump circuit according to the present invention.

In general, the present invention is an improved switching procedure for the current steering type charge pump circuit. FIG. 2 illustrates an embodiment of a charge pump circuit 2 according to the present invention. As described above, the output of a charge pump is a current pulse that drives a VCO. The amplitude of the current pulse is fixed but the timing, i.e. the turn on time of the current, is equal to the UP or DOWN signal duration. For example, if the feedback signal is early in phase, then in order to pull the phase back, the charge pump creates a correction signal, and the duration of the correction signal is proportional to the phase error. The charge pump may source or sink current, depending upon whether the required correction signal is UP or DOWN.

The charge pump circuit 2 comprises a first current source 32, a left branch 4, a right branch 6, a second current source 34, and an operational amplifier (OP-AMP) 30. The left branch 4 further comprises a first transistor M1, and a third transistor M3. The gate of M1 connected to the UP control signal, while the gate of M3 is connected to DNB control signal. The right branch 6 further comprises a second transistor M2, and a fourth transistor M4. The gate of M2 is connected to UPB control signal, while the gate of M4 is connected to DN control signal. The output of the charge pump circuit 2 is taken from the node OUT.

In the schematic of FIG. 2, a current source 32 is always "on" producing a current $I_1$. The UP and UPB are complementary signals, so that when the UP signal is asserted (i.e. turned "on"), the UPB signal goes down (i.e. is unasserted or turned "off"). For example, if the UP signal switches from a "0" to a "1" then the UPB signal will switch from a "1" to a "0". This will steer the current $I_1$ from the left side 4 of the circuit to the right side 6. Note that the UP portion of the circuit 2 sources a current pulse. The operation of the DOWN portion of the circuit 2 operates in a similar fashion, but produces a current sink pulse at the OUT node.

Figure 3:
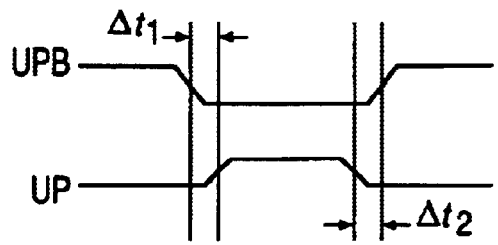
FIG. 3 is a diagram of prior art switching signals for producing an UP current pulse signal.

In the prior art charge pump implementations, during the switching process just described, both switching transistors M1 and M2 (or M3 and M4) are "on" for a brief interval during switching. This is illustrated graphically in FIGS. 3 and 4, for the UP and DOWN switching signals, respectively. The switching over-lap time ($\Delta t2$ and $\Delta t4$) occurs whether the current is being switched from left to right or from right to left. The purpose of having both transistors on for a brief period is to avoid pulling node X to the supply voltage Vdd. In other words, if there is a period of time in which no current flows through either the left 4 or right 6 branch, node X would be pulled to Vdd during this time interval. Similarly, node Y would be pulled to ground.

Figure 5:
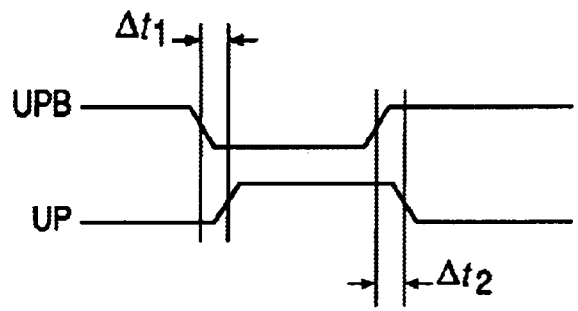
FIG. 5 is a diagram of the switching signals for producing an UP current pulse according to the present invention.
Figure 6:
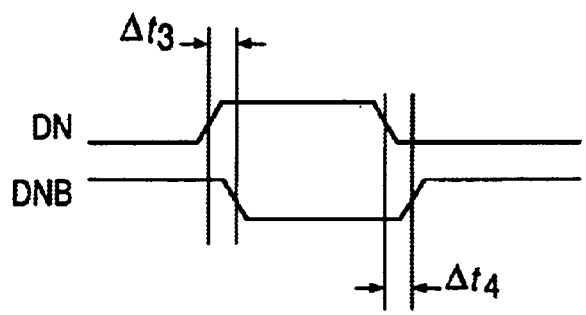
FIG. 6 is a diagram of the switching signals for producing a DOWN current pulse signal according to the present invention.
Figure 7A:
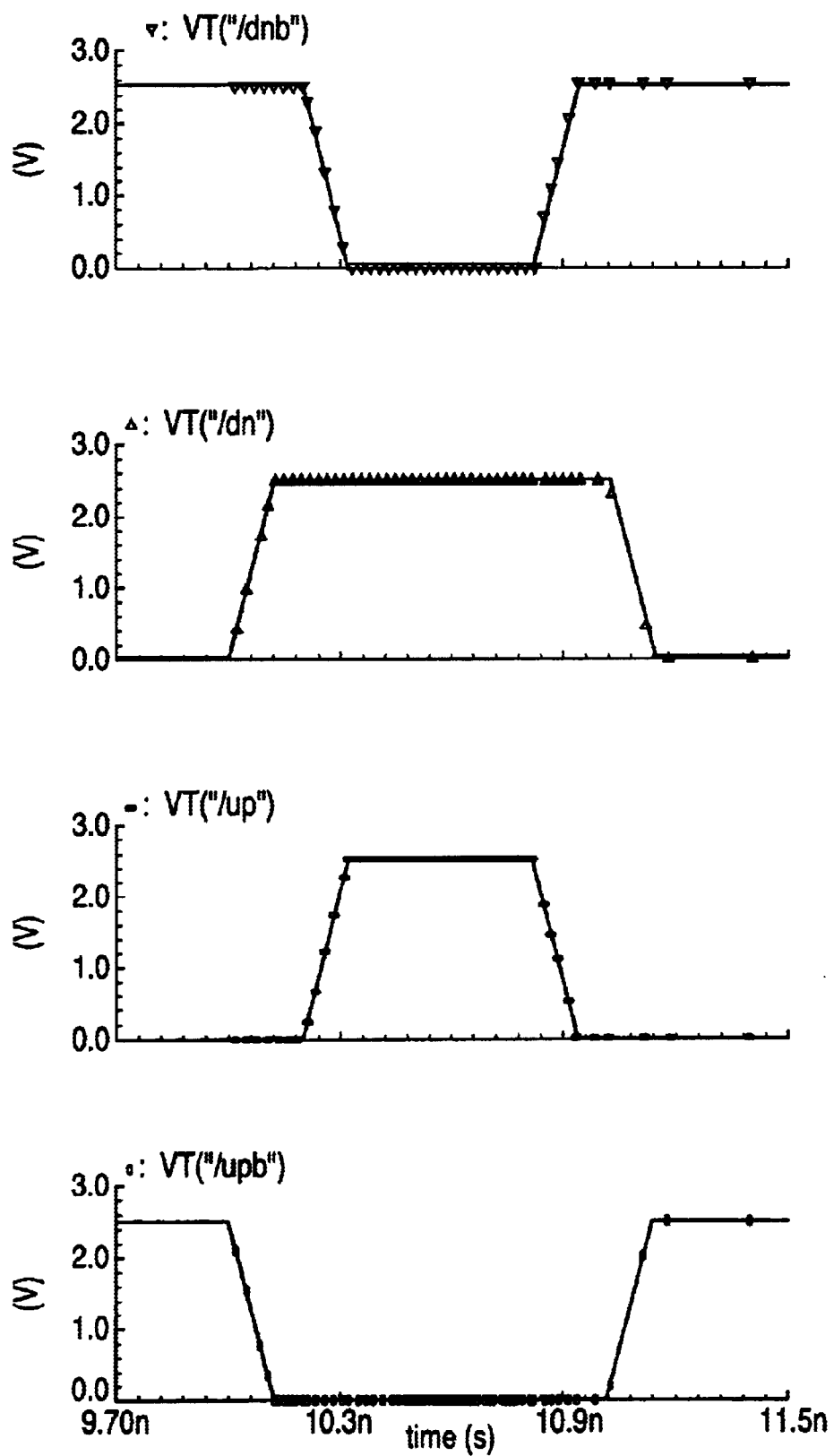
FIG. 7A is a computer simulation of the input signal timing according to the prior art.
Figure 7B:
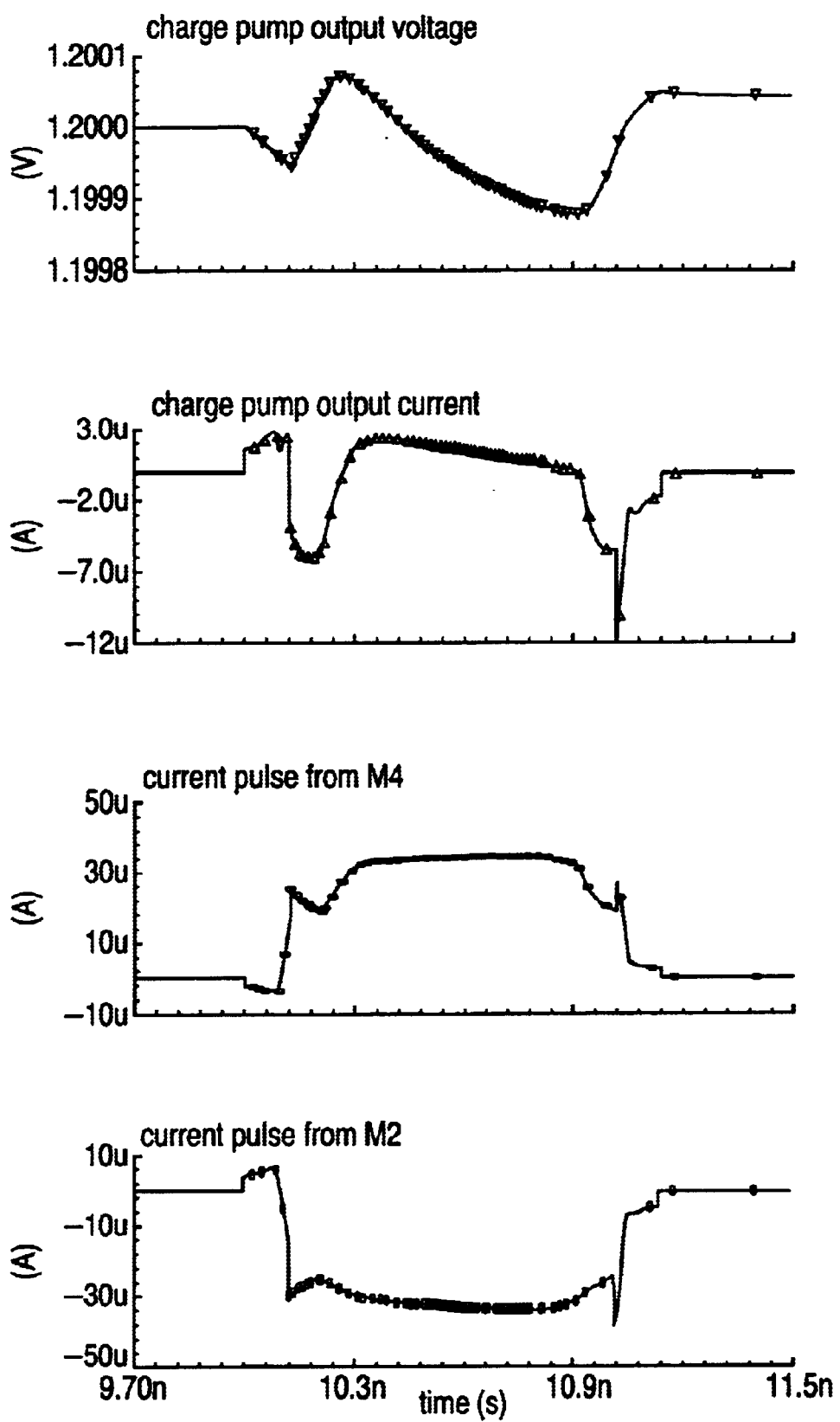
FIG. 7B is a computer simulation showing the output signals of a prior art charge pump circuit, when switched according to the inputs signals of FIG. 7A.

However, when both the UP and UPB signals (or DN and DNB) are on, switching transients from the transistors M1 and M2 as well as node X (or M3 and M4 and node Y) can affect the output signal, as shown in FIGS. 7A and 7B. The present invention partially overcomes this problem by modifying the switching signal timing, as shown in FIGS. 5 and 6.

The present invention utilizes the same timing procedure to start the current pulse. However, the timing is different to turn the pulse off. As illustrated in FIG. 5, in the present invention, the end pulse switch timing turns off the UPB signal first, and then turns off the UP signal. As a result, there could be a short period of time that node X is pulled to Vdd. However, when M2 is turned off, the output is isolated from any movement of node X. Therefore, any movement at node X or any transients in the left branch 4 will not be shown at the output. This produces a "cleaner" output signal, as compared to the prior art designs. At the time when the next UP/UPB pulses are asserted, the voltage at node X has already recovered to its steady state value. Therefore the disturbance of the node X will not affect the next UP current pulse.

Figure 4:
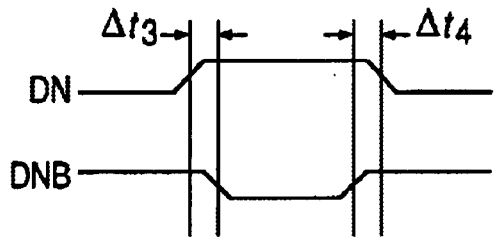
FIG. 4 is a diagram of prior art switching signals for producing a DOWN current pulse signal.

Similarly, for DOWN signals, as shown in FIG. 6, the start timing mirrors that shown in FIG. 4. However, to stop the pulse, the DN signal is asserted before the DNB signal. When M4 is turned off, the output is isolated from node Y and the rest of the circuit 2. Thus, the present invention will minimize the effect of the transients from all the voltage transitions on the output pulse at the end of the current pulse.

Figure 8A:
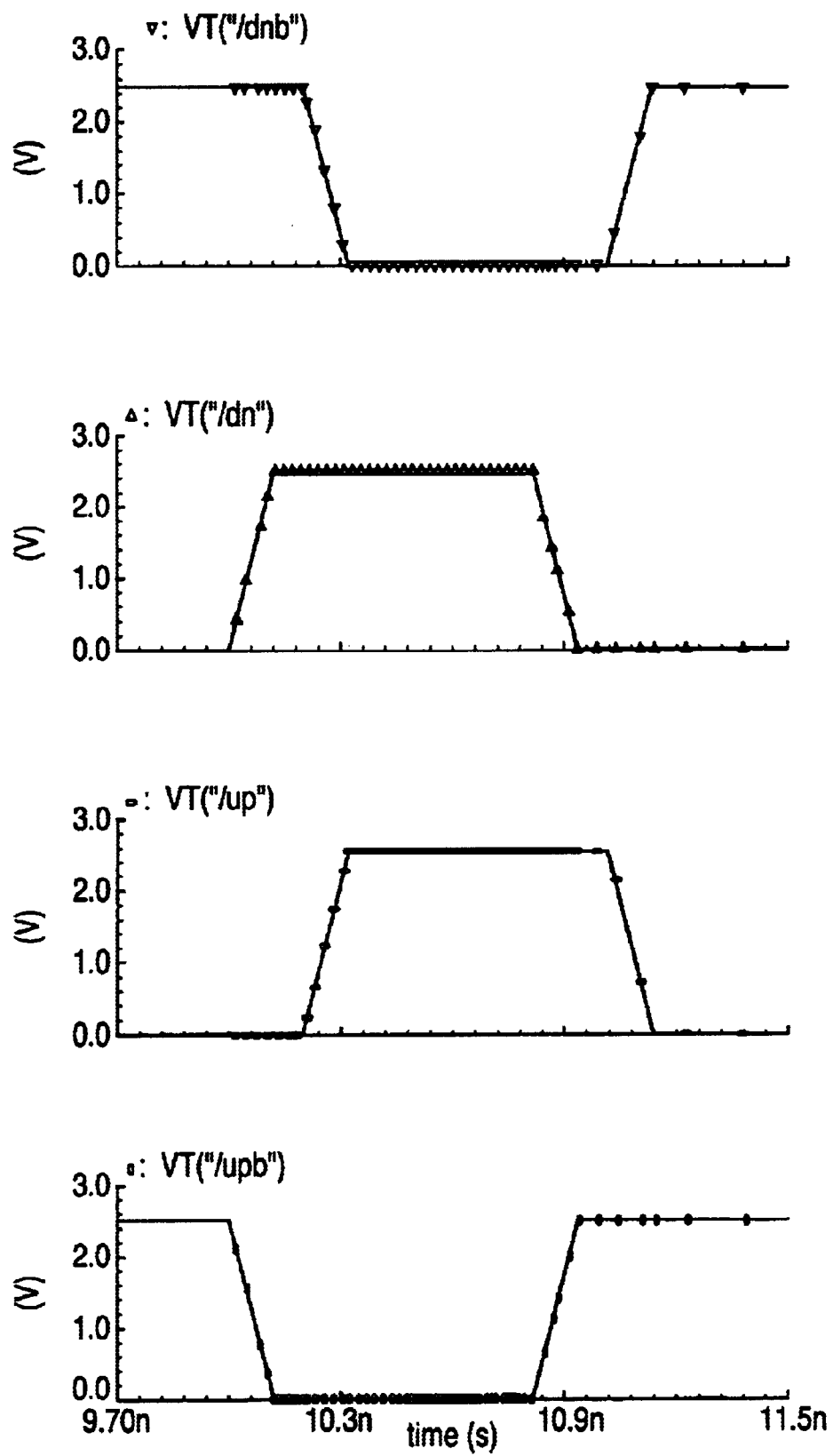
FIG. 8A is a computer simulation of the input signal timing according to the present invention.
Figure 8B:
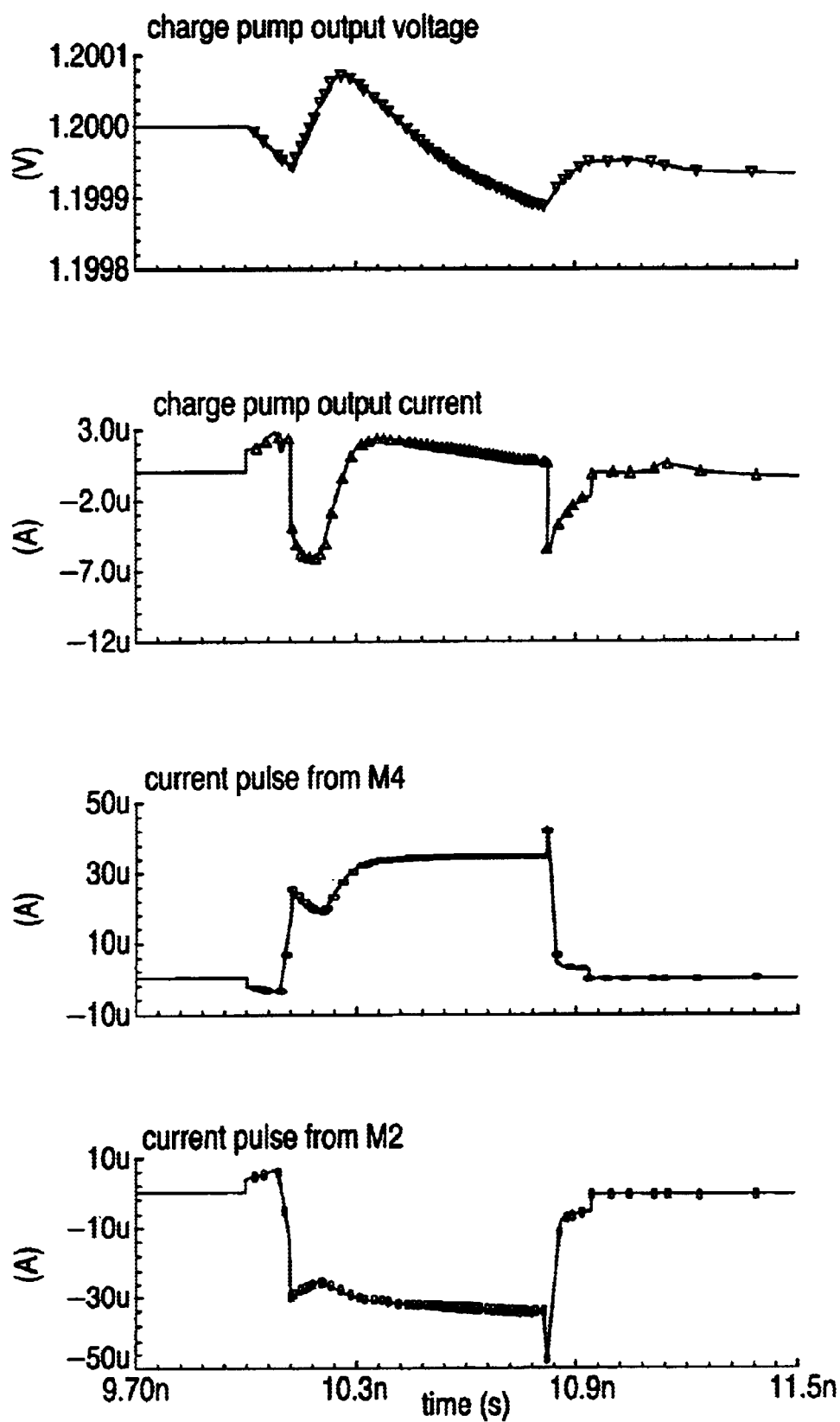
FIG. 8B is a computer simulation showing the output signal in a charge pump circuit configured according to the present invention.

FIGS. 8A and 8B are computer simulations showing the input signal timing according to the present invention and the output signals produced by the present invention. During steady state (when the PLL is locked), ideally the UP current pulse and the DOWN current pulse should cancel each other and the charge pump net output current should be zero, and the output charge pump voltage should not be disturbed. Contrasted with the prior art signal timing of FIG. 7A, it is clear that the present invention reduces the level of transient switching noise in the output signal at the end of the current pulse.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A charge pump circuit comprising:
   a first current source connected to a first node;
   a second current source connected to a second node;
   a first transistor connected between the first node and an OUTB node, the first transistor having a gate connected to an UP signal;
   a second transistor connected between the first node and an OUT node, the second transistor having a gate connected to an UPB signal;
   a third transistor connected between the OUTB node and the second node, the third transistor having a gate connected to a DNB signal;
   a fourth transistor connected between the OUT node the second node, the fourth transistor having a gate connected to a DN signal; and an operational amplifier (OP-AMP) connected between the OUT and OUTB nodes;

wherein UP and UPB are complementary signals and to produce an UP output current pulse, the UPB signal is asserted, then the UP signal is asserted, and after a predetermined period of time, the UPB signal is unasserted before the UP signal is asserted.

2. The charge pump circuit of claim 1, wherein DN and DNB are complementary signals and to produce a DOWN output current pulse, the DN signal is asserted, then the DNB signal is asserted, and after a period of time, the DN signal is unasserted before the DNB signal is unasserted.

3. The charge pump circuit of claim 2, wherein the first current source is connected between a supply voltage node and the first node.

4. The charge pump circuit of claim 3, wherein the second current source is connected between the second node and a ground node.

5. The charge pump circuit of claim 4, wherein a positive terminal of the OP-AMP is connected to the OUT node, and a negative terminal and an output terminal are connected to the OUTB node.

6. A method of forming an UP output signal pulse in a current-steering charge pump circuit, utilizing complementary UP and UPB signals, the method comprising:

asserting the UPB signal;

asserting the UP signal after the UPB signal is asserted;

holding the UPB and UP signals for a predetermined period of time;

unasserting the UPB signal; and unasserting the UP signal after UPB signal is unasserted.

7. The method of claim 6, wherein the predetermined period of time is proportional to an amount of correction needed by a voltage controlled oscillator (VCO) in a phase-locked loop circuit.

8. A method of forming a DOWN output signal pulse in a current-steering charge pump circuit, utilizing complementary DN and DNB signals, the method comprising:

asserting the DN signal;

asserting the DNB signal after the DN signal is asserted;

holding the DN and DNB signals for a predetermined period of time;

unasserting the DN signal; and unasserting the DNB signal after the DN signal is unasserted.

9. The method of claim 8, wherein the predetermined period of time is proportional to an amount of correction needed by a voltage controlled oscillator (VCO) in a phase-locked loop circuit.

* * * * *